(12) United States Patent
Cheng et al.

(10) Patent No.: US 8,445,928 B2
(45) Date of Patent: May 21, 2013

(54) LIGHT-EMITTING DIODE LIGHT SOURCE MODULE

(75) Inventors: Shi-Ming Cheng, Tainan County (TW); Wen-Liang Li, Tainan County (TW); Chang-Hsin Chu, Tainan County (TW); Hsing-Mao Wang, Tainan County (TW)

(73) Assignee: CHI MEI Lighting Technology Corp., Tainan (TW)

( * ) Notice: Subject to any disclaimer, the term of this patent is extended or adjusted under 35 U.S.C. 154(b) by 811 days.

(21) Appl. No.: 12/567,806

(22) Filed: Sep. 28, 2009

(65) Prior Publication Data

US 2010/0207142 A1 Aug. 19, 2010

(30) Foreign Application Priority Data

Feb. 18, 2009 (TW) ................................ 98105158 A

(51) Int. Cl.
*H01L 33/00* (2010.01)
(52) U.S. Cl.
USPC .............. 257/98; 257/100; 257/81; 257/99; 257/432; 257/433; 257/90; 257/95; 257/E33.067

(58) Field of Classification Search
USPC ................ 257/98, 100, 81, 99, 432, 433, 90, 257/95, E33.067
See application file for complete search history.

(56) References Cited

FOREIGN PATENT DOCUMENTS

| CN | 2692845 Y | 4/2005 |
|---|---|---|
| CN | 101060148 A | 10/2007 |
| CN | 101222010 A | 7/2008 |

*Primary Examiner* — Junghwa M Im
(74) *Attorney, Agent, or Firm* — CKC & Partners Co., Ltd.

(57) ABSTRACT

A light-emitting diode (LED) light source module is described, comprising: a heat conduction substrate, wherein a surface of the heat conduction substrate includes a plurality of recesses; a plurality of light-emitting diode chips respectively disposed in the recesses; an insulation layer disposed on the surface of the heat conduction substrate outside of the recesses; an electric conduction layer disposed on the insulation layer, wherein the light-emitting diode chips are electrically connected to the electric conduction layer; and an encapsulation layer covering the light-emitting diode chips, the electric conduction layer and the insulation layer.

20 Claims, 8 Drawing Sheets

US 8,445,928 B2

LIGHT-EMITTING DIODE LIGHT SOURCE MODULE

RELATED APPLICATIONS

This application claims priority to Taiwan Application Serial Number 98105158, filed Feb. 18, 2009, which is herein incorporated by reference.

FIELD OF THE INVENTION

The present invention relates to a light source module, and more particularly to a light-emitting diode (LED) light source module.

BACKGROUND OF THE INVENTION

With the trend towards energy conservation and environmental protection, illuminant modules using light-emitting diodes as light sources have gradually replaced common incandescent lamps and fluorescent tubes. Currently, the light-emitting diode illuminant module is fabricated by soldering surface mounting device (SMD) light-emitting diode package structures onto a circuit board using a surface mount technique. The power is provided to the circuit board and is delivered respectively to p-type electrodes and n-type electrodes of light-emitting diode chips through lead frames of the light-emitting diode package structure to make the light-emitting diode chips emit light.

However, the conventional light-emitting diode chip generally cannot transform all of the input electric energy into light energy, and the electric energy is mostly lost in the form of thermal energy, so that the transform efficiency is poor. If the heat cannot be effectively dissipated, the junction temperature of the light-emitting diode chip is further increased, thereby reducing the luminous efficiency of the light-emitting diode chip and decreasing the reliability of the light-emitting diode chip. Therefore, how to resolve the heat-dissipating problem has become an important subject of the development of the light-emitting diode device.

Refer to FIG. 1. FIG. 1 illustrates a cross-sectional view of a conventional light-emitting diode illuminant module. The conventional light-emitting diode illuminant module 100 is a surface mounting type, high power light-emitting diode illuminant module. The light-emitting diode illuminant module 100 mainly comprises a light-emitting diode package structure 136 and a circuit board 134. The light-emitting diode package structure 136 mainly comprises a light-emitting diode chip 102, a package base 104, an encapsulation layer 126 and a reflective layer 124. The package base 104 includes a lead frame 106 embedded in the package base 104. The lead frame 106 includes two leads 108 and 110 and a metal heat sink 112, wherein the metal heat sink 112 is electrically connected to the lead 110. The package base 104 is formed of polyphthalamide (PPA) by an injection-molding method and includes a cavity 118. The cavity 118 exposes a portion of the metal heat sink 112 and a portion of the lead 108, and the reflective layer 124 is disposed on a side surface of the cavity 118. The light-emitting diode chip 102 is disposed on the exposed portion of the metal heat sink 112 exposed by the cavity 118. One electrode of the light-emitting diode chip 102 is electrically connected to the metal heat sink 112, and the other electrode is electrically connected to the lead 108 via a wire 120. The encapsulation layer 126 is filled into the cavity 118 and covers the light-emitting diode chip 102, the wire 120 and the lead frame 106 exposed by the cavity 118. In order to provide a light of a desired color, the encapsulation layer 126 may be added with fluorescent powders 122.

The circuit board 134 mainly comprises a carrier substrate 128, an insulation layer 130 and a circuit layer 132, wherein the insulation layer 130 is located between the circuit layer 132 and the carrier substrate 128 to electrically isolate the carrier substrate 128 and the circuit layer 132. The circuit board 134 may be a metal core printed circuit board (MCPCB), and the carrier substrate 128 is typically an aluminum substrate. The circuit board 134 may also be a FR4 copper clad laminate. The light-emitting diode package structure 136 is disposed on the circuit board 134. The leads 108 and 110 are electrically connected to the circuit layer 132 of the circuit board 134 respectively via solder bumps 114. The metal heat sink 112 is connected to the carrier substrate 128 of the circuit board 134 via a solder bump 116 to dissipate the heat produced by the light-emitting diode chip 102.

In order to increase the heat-dissipating efficiency of the light-emitting diode illuminant module 100, the light-emitting diode chip 102 of the light emitting diode illuminant module 100 is connected to the metal heat sink 112 of the lead frame 106 to conduct the heat produced by the light-emitting diode chip 102 directly downward to the underlying carrier substrate 128 of the circuit board 134. Therefore, a better heat-dissipating effect of the light-emitting diode illuminant module 100 can be obtained by using the carrier substrate 128 made of the aluminum substrate.

However, the light-emitting diode chip 102 of the conventional light-emitting diode illuminant module 100 needs to be packed on the package base 104 formed of polyphthalamide by a package factory in advance, and then delivered to so called SMT (Surface Mounted Technology) factory to mount the light-emitting diode package structure 136 on the circuit board 134. In addition, the metal heat sink 112 needs to be formed simultaneously with the lead frame 106, so that the irregular and large thickness difference of the lead frame 106 will further complicate the process to fabricate the lead frame 106 and causes a material waste issue. These package and manufacture procedures all increase the complexity of the process of the light-emitting diode illuminant module 100. Furthermore, the light-emitting diode chip 102 is usually connected to the metal heat sink 112 by sliver glue, so that the heat conduction of the light-emitting diode chip 102 is limited by the heat-conducting ability of the silver glue, thereby resulting in a poor heat-dissipating effect. When the circuit board 134 is an FR4 substrate, the heat dissipating effect of the light-emitting diode illuminant module 100 is poor due to low thermal conduction coefficient of the FR4 substrate. When the circuit board 134 is a metal core printed circuit board, the cost of such circuit board 134 is high because the process of the metal core printed circuit board is complicated. Moreover, after performing the anneal process following the surface mounting technology bonding process used to bond the lead frame 106 of the light-emitting diode illuminant structure 136 and the circuit layer 132 of the circuit board 134, a failure of an unevenness of solder bumps 114 between leads 108 and 110 is easily found. As a result, the light-emitting diode package structure 136 is oblique, so that the collinearity of the light-emitting diode package structure 136 is poor, thereby degrading the illuminant uniformity of the light-emitting diode illuminant module 100.

SUMMARY OF THE INVENTION

Therefore, one objective of the present invention is to provide a light-emitting diode light source module, in which light-emitting diode chips are embedded in a heat conduction substrate, so that the contact area between the light-emitting diode chips and the heat conduction substrate is increased. In addition, the volume of the heat conduction substrate is much larger than those of the light-emitting diode chips, and it is not necessary to use the conventional sliver glue to fix the light-emitting diode chips. Therefore, the heat produced by the light-emitting diode chips can be rapidly conducted to the external environment, and the issue of the reduction of the luminous flux per watt resulting from the superheat of the light-emitting diode chips can be effectively solved.

Another objective of the present invention is to provide a light-emitting diode light source module. In the manufacturing of the light-emitting diode light source module, light-emitting diode chips are directly integrated to a heat conduction substrate, and the semiconductor fabrication techniques including a film disposition technique, a photolithograph technique and an etching technique cooperating with the conventional wire bonding technique can be used to connect the light-emitting diode chips and the circuit on the circuit substrate. Therefore, it is unnecessary to use polyphthalamide to form a package base of the light-emitting diode, the formation of the conventional lead is not needed, and the process of combining the package base and the lead frame is not needed. Accordingly, in comparison with the conventional technique, the present invention has advantages of process simplification and low cost.

Still another objective of the present invention is to provide a light-emitting diode light source module. In the fabrication of the light-emitting diode light source module, an encapsulation material is filled between a transparent substrate and a heat conduction substrate by a batch method. In addition, a fluorescent layer may be entirely coated on the transparent substrate by a spin coating method or partially coated on the transparent substrate by a screen-printing method. Therefore, in comparison with the conventional package method of the light-emitting diode, it is unnecessary to pack the light-emitting diode chips one by one in the present invention. Accordingly, the thicknesses of the entire fluorescent layer and the entire encapsulation layer can be controlled, thereby increasing the uniformity of the process, effectively simplifying the package process and greatly reducing the package time.

Further another objective of the present invention is to provide a light-emitting diode light source module, in which a transparent substrate can be set with an optical structure, so that in addition to protecting the underlying light-emitting diode chips, the transparent substrate can enhance optical effects, such as increasing the light-extracting efficiency, enhancing the light uniformity and reducing the light-mixing distance, by designing the optical structure of the transparent substrate. Furthermore, a reflective layer may be disposed on a light-extracting side of the light-emitting diode chip, so that the light-extracting efficiency can be effectively increased.

Still further another objective of the present invention is to provide a light-emitting diode light source module, in which the conventional lead frame is not needed to connect a light-emitting diode package structure, so that the poor collinearity of the light-emitting diode chips caused by the non-uniform solders in the reflow process of the lead frame can be prevented.

According to the aforementioned objectives, the present invention provides a light-emitting diode light source module, comprising: a heat conduction substrate, wherein a surface of the heat conduction substrate includes a plurality of recesses; a plurality of light-emitting diode chips respectively disposed in the recesses; an insulation layer disposed on the surface of the heat conduction substrate outside of the recesses; an electric conduction layer disposed on the insulation layer, wherein the light-emitting diode chips are electrically connected to the electric conduction layer; and an encapsulation layer covering the light-emitting diode chips, the electric conduction layer and the insulation layer.

According to a preferred embodiment of the present invention, the light-emitting diode chips are embedded in the recesses of the heat conduction substrate.

According to another preferred embodiment of the present invention, each of the light-emitting diode chips is disposed on a bottom surface of each of the recesses and is separated from a side surface of each of the recesses. Furthermore, each of the recesses is preferably bowl-shaped.

According to still another preferred embodiment of the present invention, the light-emitting diode light source module further comprises a fluorescent layer disposed between the light-emitting diode chips and the transparent substrate.

BRIEF DESCRIPTION OF THE DRAWINGS

The foregoing aspects and many of the attendant advantages of this invention are more readily appreciated as the same become better understood by reference to the following detailed description, when taken in conjunction with the accompanying drawings, wherein.

DETAILED DESCRIPTION OF THE PREFERRED EMBODIMENT

Figure 1:
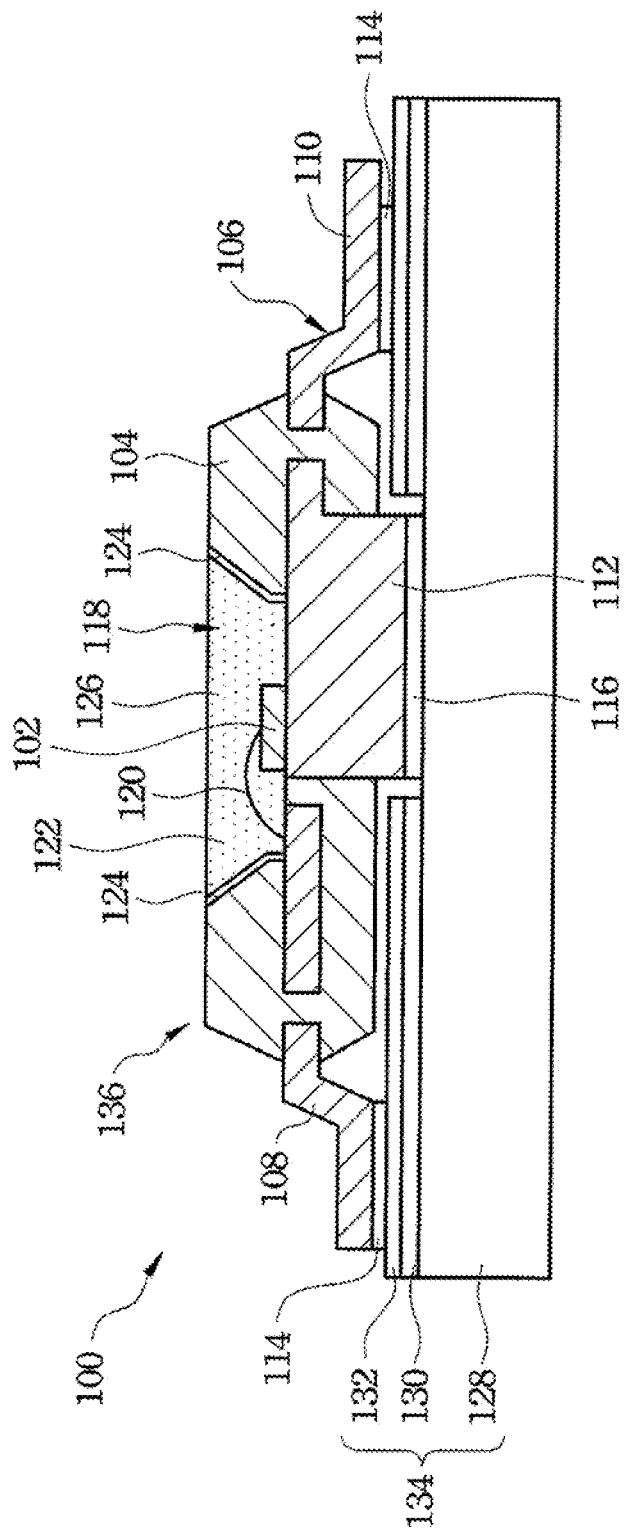
FIG. 1 illustrates a cross-sectional view of a conventional light-emitting diode illuminant module.
Figure 2A:
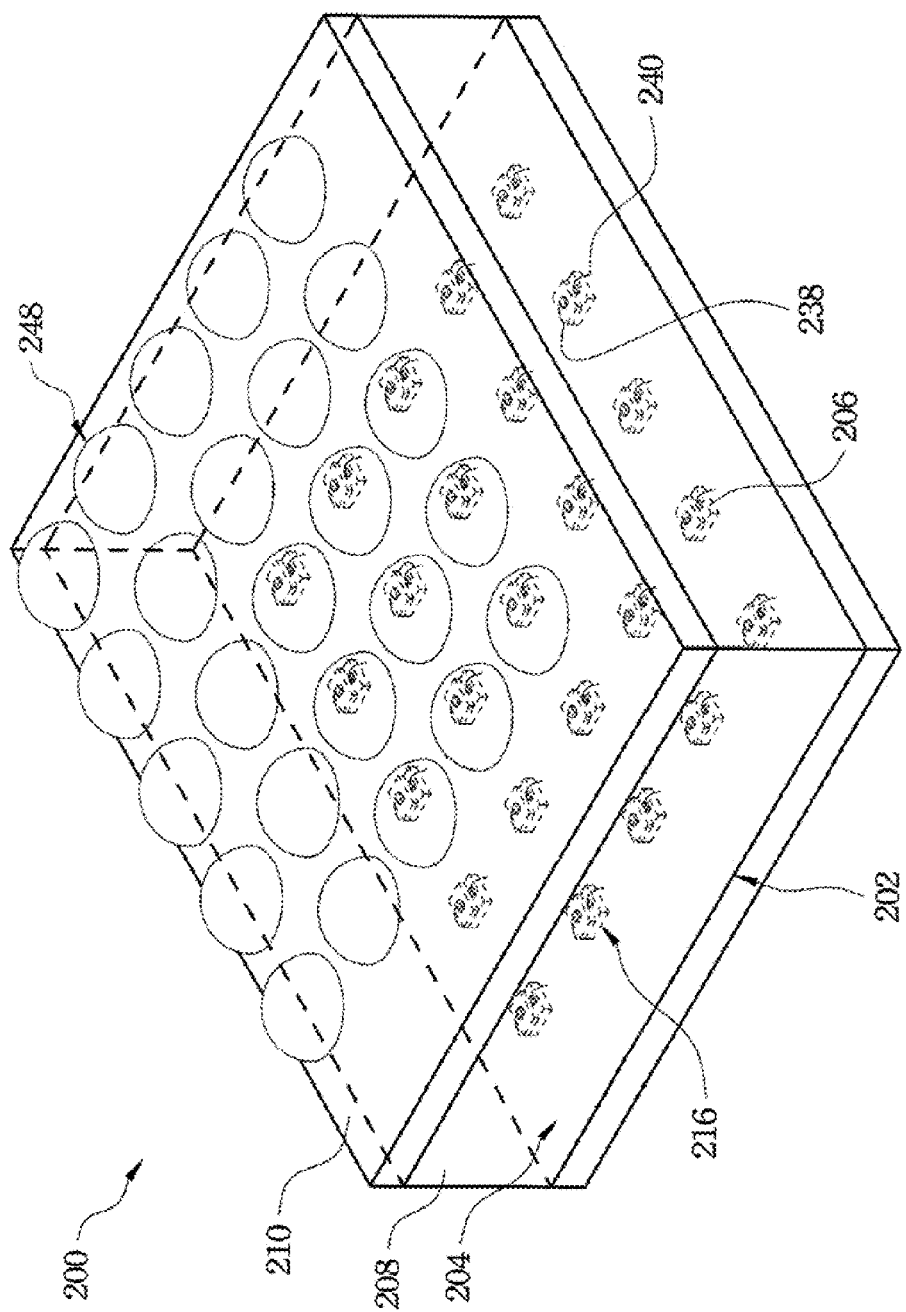
FIG. 2A is a three-dimensional perspective drawing of a light-emitting diode light source module in accordance with a preferred embodiment of the present invention.
Figure 2B:
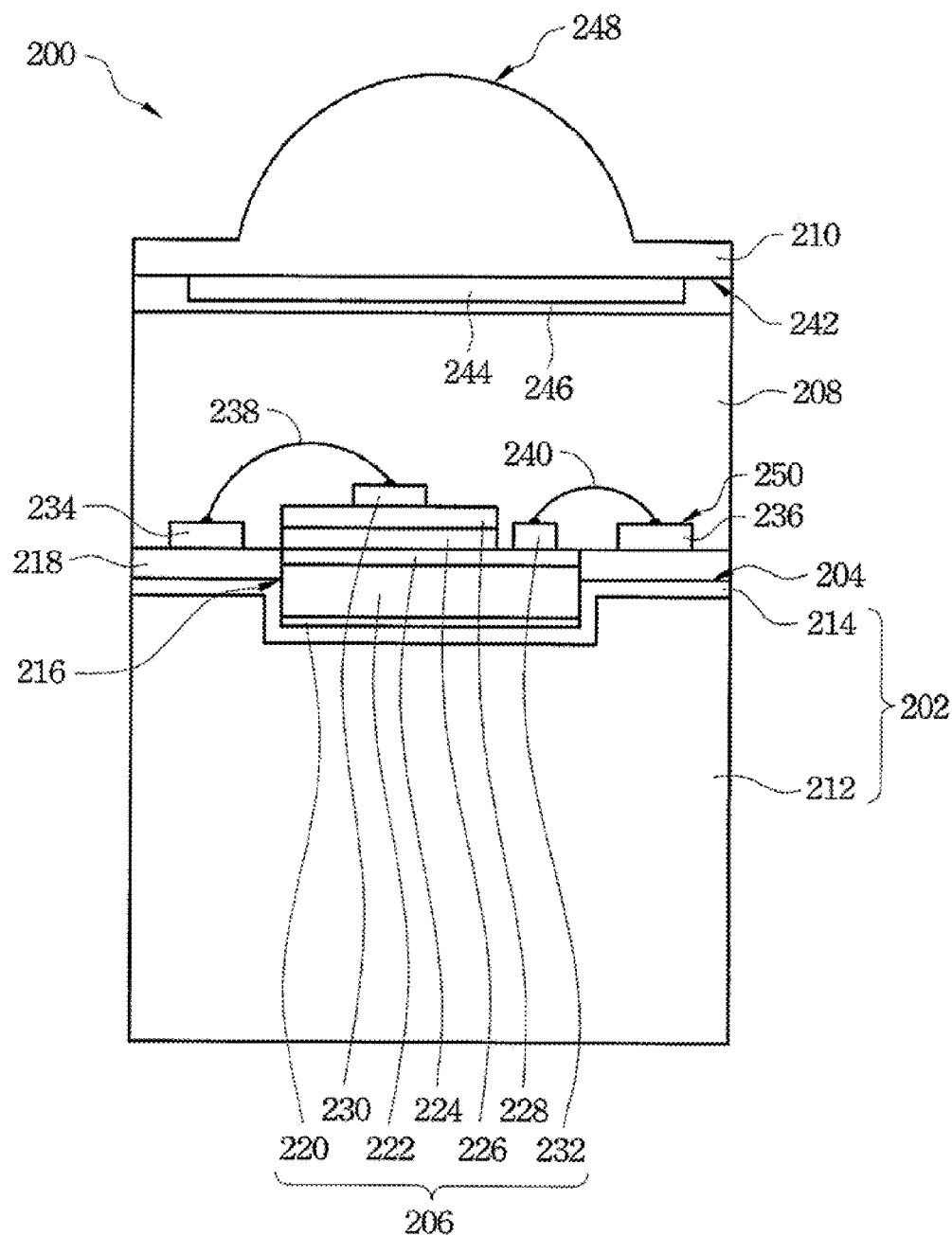
FIG. 2B illustrates a cross-sectional view of a light-emitting diode light source module in accordance with a preferred embodiment of the present invention.

Refer to FIGS. 2A and 2B. FIGS. 2A and 2B respectively illustrate a three-dimensional perspective drawing and a cross-sectional view of a light-emitting diode light source module in accordance with a preferred embodiment of the present invention. In one exemplary embodiment, a light-emitting diode light source module 200 comprises a heat conduction substrate 202, a plurality of light-emitting diode chips 206, one or more insulation layers 218, one or more electric conduction layers 250, an encapsulation layer 208 and preferable a transparent substrate 210. The light-emitting diode chips 206 can be arranged according to the practical requirements, so that the light-emitting diode chips 206 can be arranged uniformly or irregularly.

In one embodiment, each of the light-emitting diode chips 206 is a light-emitting diode structure with horizontal electrodes. Each of the light-emitting diode chips 206 mainly comprises a substrate 222, a first conductivity type semiconductor layer 224, an active layer 226, a second conductivity type semiconductor layer 228, a first electrode 232 and a second electrode 230. In the light-emitting diode chip 206, the first conductivity type semiconductor layer 224, the active layer 226 and the second conductivity type semiconductor layer 228 may be sequentially formed to stack on the substrate 222 by, for example, an epitaxy growth method. Then, a definition step is performed by, for example, a photolithography technique and an etching technique, to remove a portion of the second conductivity type semiconductor layer 228 and a portion of the active layer 226 to expose a portion of the first conductivity type semiconductor layer 224. After defining, the active layer 226 is disposed on a portion of the first conductivity type semiconductor layer 224, the second conductivity type semiconductor layer 228 is disposed on the active layer 226. The first conductivity type and the second conductivity type are different conductivity types. For example, when one of the first and second conductivity types is p-type, the other one of the first and second conductivity types is n-type. Then, the first electrode 232 and the second electrode 230 are respectively disposed on the exposed portion of the first conductivity type semiconductor layer 224 and the second conductivity type semiconductor layer 228. The substrate 222 may be a transparent substrate, such as a sapphire substrate. The materials of the first conductivity type semiconductor layer 224, the active layer 226 and the second conductivity type semiconductor layer 228 are, for example, GaN-based materials. In some embodiments, in order to increase the light-extracting efficiency, a reflective layer 220 may be selectively formed on a bottom surface of the substrate 222, such as shown in FIG. 2B. In another embodiment, a transparent electric conduction layer (not shown) may be selectively formed between the second conductivity type semiconductor layer 228 and the second electrode 230 to make the light-emitting diode structure achieve better current distribution and high luminous efficiency. The transparent electric conduction layer may be, for example, an indium tin oxide (ITO) layer or a thin metal layer.

In other embodiments, the light-emitting diode chip may be a light-emitting diode structure with vertical electrodes, i.e. the first electrode and the second electrode of different conductivity types in the light-emitting diode structure are respectively disposed on opposite sides of the substrate 222. In another embodiment, the light-emitting diode chip may include a flip-chip structure and is disposed on the heat conduction substrate by a flip-chip method.

The heat conduction substrate 202 may be a single-layered structure or a multi-layered stack compound structure. Such as shown in FIG. 2B, in the present exemplary embodiment, the heat conduction substrate 202 is a compound structure and comprises a metal substrate 212 and an electric conduction compound layer 214 disposed on the metal substrate 212. The material of the metal substrate 212 may be, for example, Cu or Al. The material of the electric conduction compound layer 214 may be, for example, ITO, Au, Ag, Pt, Pd, Ni, Cr, Ti, Ta, Al, In, W, Cu, or an alloy containing Ni, Cr, Ti, Ta, Al, In, W or Cu. In one exemplary embodiment, the thickness of the electric conduction compound layer 214 is, for example, less than substantially 3 μm. A surface 204 of the heat conduction substrate 202 may include a plurality of recesses 216. The light-emitting diode chips 206 are respectively disposed in the recesses 216 of the surface 204 of the heat conduction substrate 202.

In one exemplary embodiment, the light-emitting diode chips 206 are correspondingly embedded in the recesses 216 of the surface 204 of the heat conduction substrate 202. In the present exemplary embodiment, the necessary protection step of the light-emitting diode chips 206 is firstly performed, for example, to mask the first conductivity type semiconductor layer 224, the active layer 226, the second conductivity type semiconductor layer 228, the first electrode 232 and the second electrode 230. Then, the electric conduction compound layer 214 is formed on the rear surfaces of the light-emitting diode chips 206 by, for example, a coating method, an evaporation method, a sputtering method or an electroless plating method. Next, the metal substrate 212 is formed on the electric conduction compound layer 214 on the rear surfaces of the light-emitting diode chips 206 by an electroplating method to complete the fabrication of the heat conduction substrate 202. In other words, the electric conduction compound layer 214 is formed on the rear surfaces of the light-emitting diode chips 206 to act as an electroplating seed layer and an adhere layer to adhere the light-emitting diode chips 206 and the metal substrate 212, so that the light-emitting diode chips 206 are disposed on the electric conduction compound layer 214 in the light-emitting diode light source module 200. In addition, the metal substrate 212 is formed by an electroplating method, so that the metal substrate 212 is an electroplated substrate and is adhered to the bottoms of the light-emitting diode chips 206 via the electric conduction compound layer 214 by an electroplating bonding method.

In the light-emitting diode light source module 200, each light-emitting diode chip 206 is partially embedded in the heat conduction substrate 202, so that the contact area between the light-emitting diode chip 206 and the heat conduction substrate 202 is increased, the light-emitting diode chip 206 can be fixed on the heat conduction substrate 202 without using heat conduction glue, such as sliver glue. In addition, the volume of the heat conduction substrate 202 is far larger than the volume of the light-emitting diode chip 206. Therefore, the heat produced by the light-emitting diode chips 206 can be rapidly conducted to the external environment, and the issue of the reduction of the luminous flux per watt resulting from the superheat of the light-emitting diode chips 206 can be solved.

Next, the insulation layer 218 is formed on the surface 204 of the heat conduction substrate 202 outside of the recesses 216 by, for example, a film deposition method. The material of the insulation layer 218 may be, for example, silicon dioxide ($SiO_2$) or silicon nitride ($SiN_x$). In one exemplary embodiment, such as shown in FIG. 2B, the first conductivity type semiconductor layer 224 of the light-emitting diode chip 206 and the insulation layer 218 may have a substantially equal altitude, such that it is beneficial to the formation of the electrical connection between the first electrode 232 of the light-emitting diode chip 206 and a circuit 236 of an electric conduction layer 250 formed sequentially. Further, the circuit 236 of the electric conduction layer 250 and the first electrode 232 of the light-emitting diode chip 206 can be manufactured simultaneously.

Then, the electric conduction layer 250 is formed on the insulation layer 218 by, for example, a film deposition technique. The electric conduction layer 250 comprises circuits 234 and 236 defined by a pattern definition technique, such as a photolithography and etching technique. The circuits 234 and 236 are connection lines between the light-emitting diode chips 206 in the light-emitting diode light source module 200. In the present exemplary embodiment, the second electrode 230 and the first electrode 232 of each light-emitting diode chip 206 may be electrically connected to the circuits 234 and 236 respectively via wires 238 and 240 by, for example, a wire bonding method. It is worthy of note that the first electrode 232 and the circuit 236 may be also directly defined as an electrically connected pattern (not shown) by a pattern definition technique, such as a photolithography and etching technique, and the wire 240 does not need to form the electrical connection between the first electrode 232 and the circuit 236. In other embodiments, the electrical connection between the light-emitting diode chip 206 and the electric conduction layer 250 may be formed by a flip-chip bonding method.

Figure 3A:
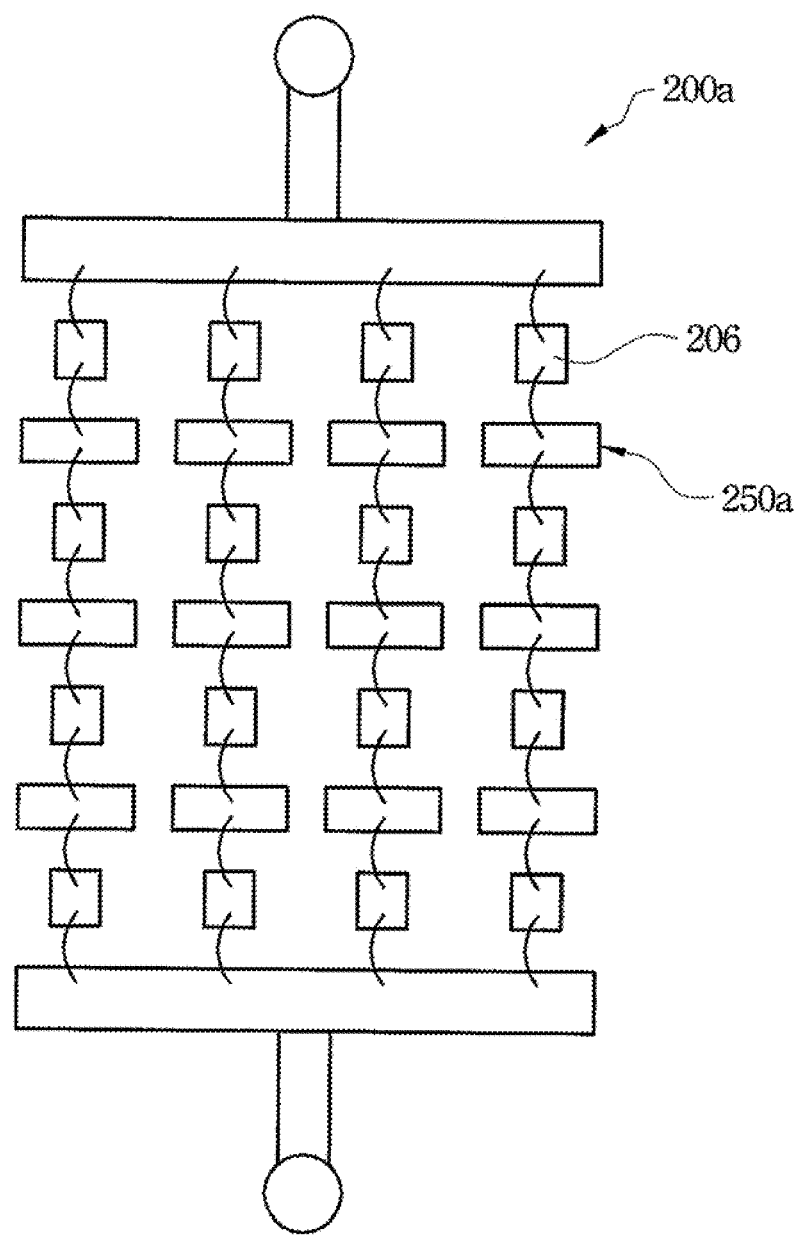
FIG. 3A is a schematic diagram showing a connection circuit of a light-emitting diode light source module in accordance with a preferred embodiment of the present invention.
Figure 3B:
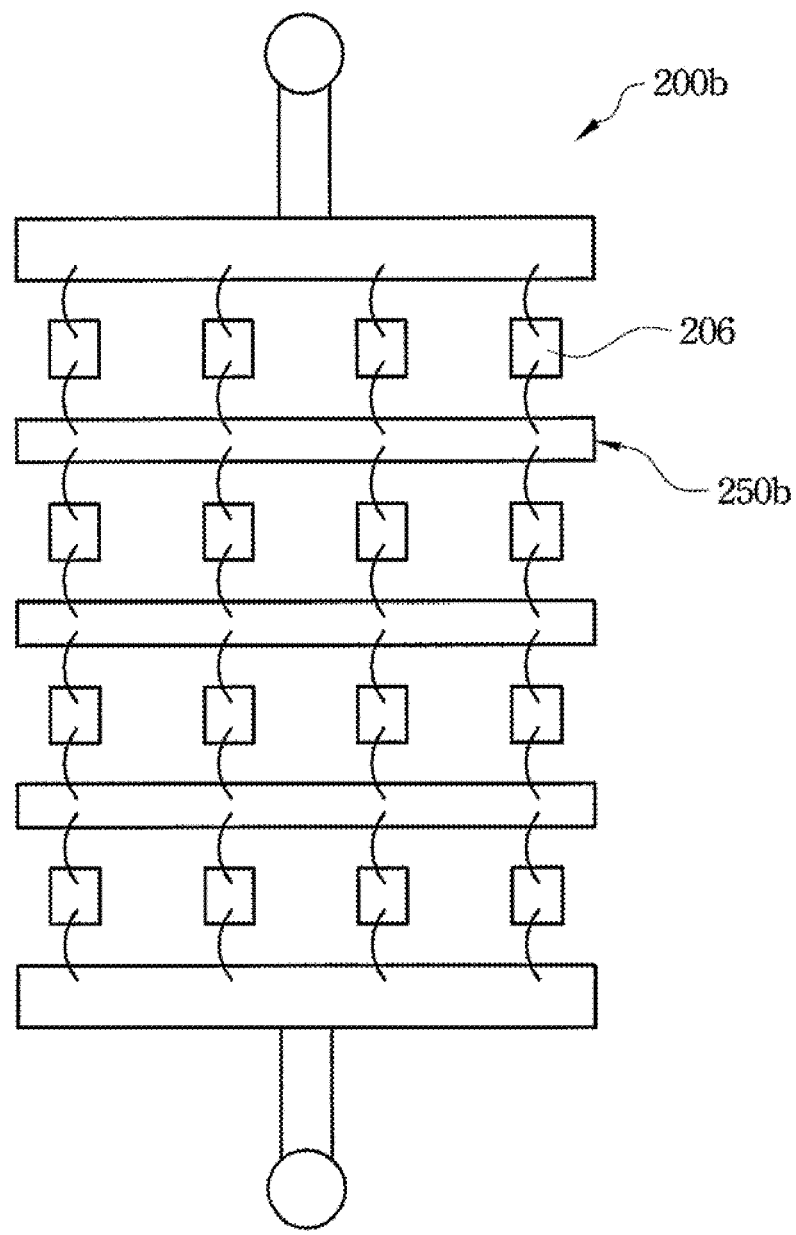
FIG. 3B is a schematic diagram showing a connection circuit of a light-emitting diode light source module in accordance with another preferred embodiment of the present invention.

According to the requirement of the product design, the connection circuit of the light-emitting diode light source module of the present invention may be, for example, a series-parallel connection circuit or a parallel-serial connection circuit. Refer to FIGS. 3A and 3B. FIGS. 3A and 3B are schematic diagrams respectively showing connection circuits of two light-emitting diode light source modules in accordance with two preferred embodiments of the present invention. In a light-emitting diode light source module 200a, an electric conduction layer 250a in each row is discontinuous, and the connection method between the light-emitting diode chips 206 is a series-parallel connection method, i.e. the light-emitting diode chips 206 are firstly connected to form several columns in series connection, and the columns of the light-emitting diode chips 206 in series connection are then connected in parallel connection, such as shown in FIG. 3A. In a light-emitting diode light source module 200b, an electric conduction layer 250b in each row is continuous, and the connection method between the light-emitting diode chips 206 is a parallel-serial connection method, i.e. the light-emitting diode chips 206 are firstly connected to form several rows in parallel connection, and the rows of the light-emitting diode chips 206 in parallel connection are then connected in series connection, such as shown in FIG. 3B. In the light-emitting diode light source module 200b, when one of the light-emitting diode chips 206 is damaged, the operation of the other light-emitting diode chips 206 is not affected.

The transparent substrate 210 may be, for example, a glass substrate or an optical polycarbonate (PC) board. The transparent substrate 210 may be a transparent flat panel without an additional optical structure set thereon. In one exemplary embodiment, the transparent substrate 210 is set with an optical structure 248 according to the design requirement. The optical structure 248 may include a plurality of convex lenses, a plurality of prisms, or a scattering structure, such as a sand blasting surface structure, to enhance the optical output effect, such as increasing the uniformity of the optical outputting or providing an anti-dizzy effect.

The light-emitting diode light source module 200 may be selectively set with a fluorescent layer or may not be set with a fluorescent layer. For example, in accordance with the application of a white-light light source module, if the light-emitting diode chips 206 include red, green and blue light-emitting diode chips, white light can be provided by directly mixing the light emitted by the red, green and blue light-emitting diode chips, and a fluorescent layer is not needed. Also, for the light source module which does not need to emit white light, a fluorescent layer is not needed, and the light emitted by the light-emitting diode chips 206 can be used as the outputting light of the light-emitting diode light source module 200. In one exemplary embodiment, the light-emitting diode light source module 200 comprises a fluorescent layer 244 disposed between the light-emitting diode chip 206 and the transparent substrate 210. For example, the fluorescent layer 244 is disposed on a bottom surface 242 of the transparent substrate 210 and faces the light-emitting diode chip 206, such as shown in FIG. 2B. According to the design requirement, the fluorescent layer 244 may be coated on the entire bottom surface 242 of the transparent substrate 210. However, in order to save the fluorescent materials, the fluorescent layer 244 may be coated on the bottom surface 242 of the transparent substrate 210 partially. For example, the fluorescent layer 244 may be only coated within the main luminous scope of the light-emitting diode chip 206 as long as the light emitted by the light-emitting diode chip 206 can be completely wave converted with the fluorescent powders of the fluorescent layer 244. For example, in the application of the white-light light source module, when the light emitted by the light-emitting diode chip 206 is on the blue light wave band, a yellow fluorescent layer composed of, for example, YAG-based fluorescent powders, BOSE-based fluorescent powders or a mixture of red fluorescent powders and green fluorescent powders, may be coated on the entire bottom surface 242 of the transparent substrate 210 by a spin coating method.

According to the practical design requirements, the light-emitting diode light source module 200 may be selectively set with an anti-reflection layer 246, such that the light emitted by the light-emitting diode chip 206 can pass through the anti-reflection layer 246 without being reflected to decrease the loss of the light. In one exemplary embodiment, such as shown in FIG. 2B, the anti-reflection layer 246 covers the fluorescent layer 244 on the bottom surface 242 of the transparent substrate 210, so that the fluorescent layer 244 is located in between the bottom surface 242 of the transparent substrate 210 and the anti-reflection layer 246. In another embodiment, the locations of the anti-reflection layer 246 and the fluorescent layer 244 on the bottom surface 242 of the transparent substrate 210 may be exchanged, i.e. the anti-reflection layer 246 is firstly formed to cover the bottom surface 242 of the transparent substrate 210 and the fluorescent layer 244 is then formed to cover the anti-reflection layer 246. As a result, the anti-reflection layer 246 is located in between the bottom surface 242 of the transparent substrate 210 and the fluorescent layer 244. Such arrangement also can provide the effect of decreasing the loss of the light resulting from reflecting. In other embodiments, the fluorescent layer 244 may be formed to directly cover the light-emitting diode chip 206 and the heat conduction substrate 202, and the anti-reflection layer 246 may be disposed on the bottom surface 242 of the transparent substrate 210.

Then, the transparent substrate 210 and the heat conduction substrate 202, which includes the light-emitting diode chips 206 set thereon, are aligned and combined, and then an encapsulation material, such as silicone or epoxy, is filled into the space between the transparent substrate 210 and the conduction substrate 202 to form an encapsulation layer 208, so as to seal the light-emitting diode chips 206 and to combine the heat conduction substrate 202 and the transparent substrate 210. With the seal of the encapsulation layer 208, humidity can be prevented from permeating so that decreasing life of the light-emitting diode chips 206 can be prevented. As a result, the encapsulation layer 208 covers the light-emitting diode chips 206, the circuits 234 and 236 of the electric conduction layer 250 and the exposed insulation layer 218, and the transparent substrate 210 is located on the encapsulation layer 208. Such as shown in FIG. 2B, in one exemplary embodiment, the optical structure 248 of the transparent substrate 210 includes a plurality of convex lenses, therefore the encapsulation layer 208 preferably has a thickness that makes the light-emitting diode chip 206 be located on about the focus point of the convex lens of the transparent substrate 210, so that a better uniformity of the emitting light can be obtained. However, in other embodiments, the adjustment is based on the uniform light-emitting effect practically, and the light-emitting diode chip 206 may be located within or outside the focal length of the convex lens of the transparent substrate 210 and is not particularly limit to being on the focus of the convex lens of the transparent substrate 210.

Figure 4:
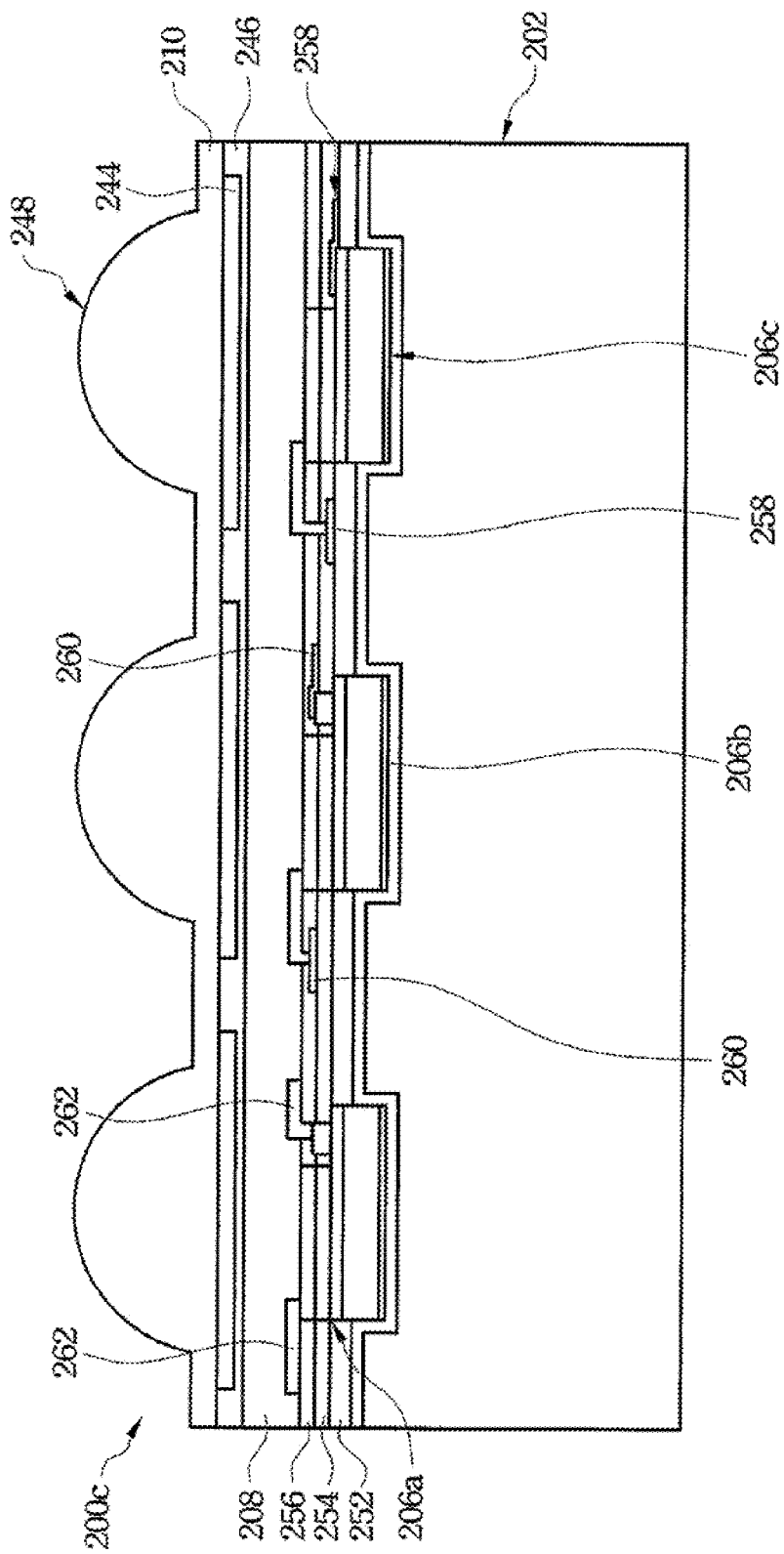
FIG. 4 illustrates a cross-sectional view of a light-emitting diode light source module in accordance with another preferred embodiment of the present invention.

The light-emitting diode light source module of the present invention may comprise several insulation layers and several electric conduction layers for a more complicated circuit design. Refer to FIG. 4. FIG. 4 illustrates a cross-sectional view of a light-emitting diode light source module in accordance with another preferred embodiment of the present invention. In another exemplary embodiment, the structure of the light-emitting diode light source module 200c is substantially the same as the structure of the light-emitting diode light source module 200, and the great difference is that the light-emitting diode light source module 200c comprises at least one red light-emitting diode chip 206a, at least one green light-emitting diode chip 206b and at least one blue light-emitting diode chip 206c, and the light-emitting diode light source module 200c comprises several insulation layers 252, 254 and 256 in a stack and several electric conduction layers 258, 260 and 262. In the light-emitting diode light source module 200c, the red light-emitting diode chip 206a, the green light-emitting diode chip 206b and the blue light-emitting diode chip 206c are disposed on the heat conduction substrate 202. The red, green and blue light-emitting diode chips typically have different forward voltages ($V_f$) respectively, so that individual circuits are respectively designed in the insulation layers 252, 254 and 256 according to the different light-emitting diode chips. In one exemplary embodiment, the insulation layer 252 is disposed on the heat conduction substrate 202, the insulation layer 254 is stacked on the insulation layer 252, the insulation layer 256 is stacked on the insulation layer 254, the electric conduction layer 258 is disposed on the insulation layer 252 and is electrically connected to the blue light-emitting diode chip 206c, the electric conduction layer 260 is disposed on the insulation layer 254 and is electrically connected to the green light-emitting diode chip 206b, and the electric conduction layer 262 is disposed on the insulation layer 256 and is electrically connected to the red light-emitting diode chip 206a. With the design of the insulation layers 252, 254 and 256 and the electric conduction layers 258, 260 and 262, a multi-layers circuit design can be provided, and each of the red light-emitting diode chip 206a, the green light-emitting diode chip 206b and the blue light-emitting diode chip 206c has an independent circuit in different layers.

It is worthy of note that in the present exemplary embodiment, the insulation layers 252, 254 and 256 and the electric conduction layers 258, 260 and 262, and even the electrodes of the light-emitting diode chips 206a, 206b and 206c can be formed by a film deposition technique, a photolithography technique and an etching technique in the semiconductor process, so that the process of the light source module can be further integrated, and the process of connecting the electrodes and respective circuits by using the metal wires can be replaced to decrease the amount of the process steps.

Figure 5A:
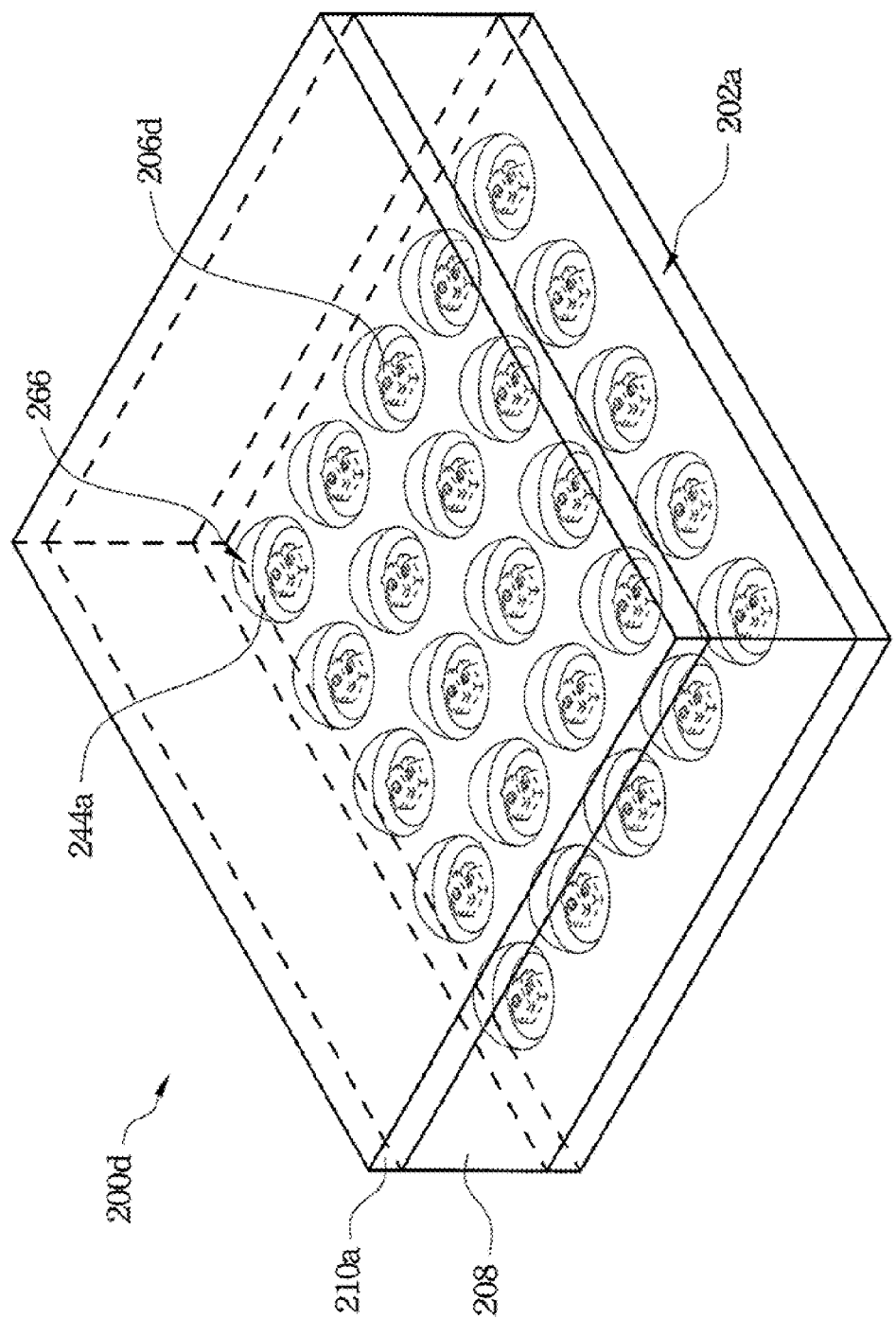
FIG. 5A is a three-dimensional perspective drawing of a light-emitting diode light source module in accordance with another preferred embodiment of the present invention.
Figure 5B:
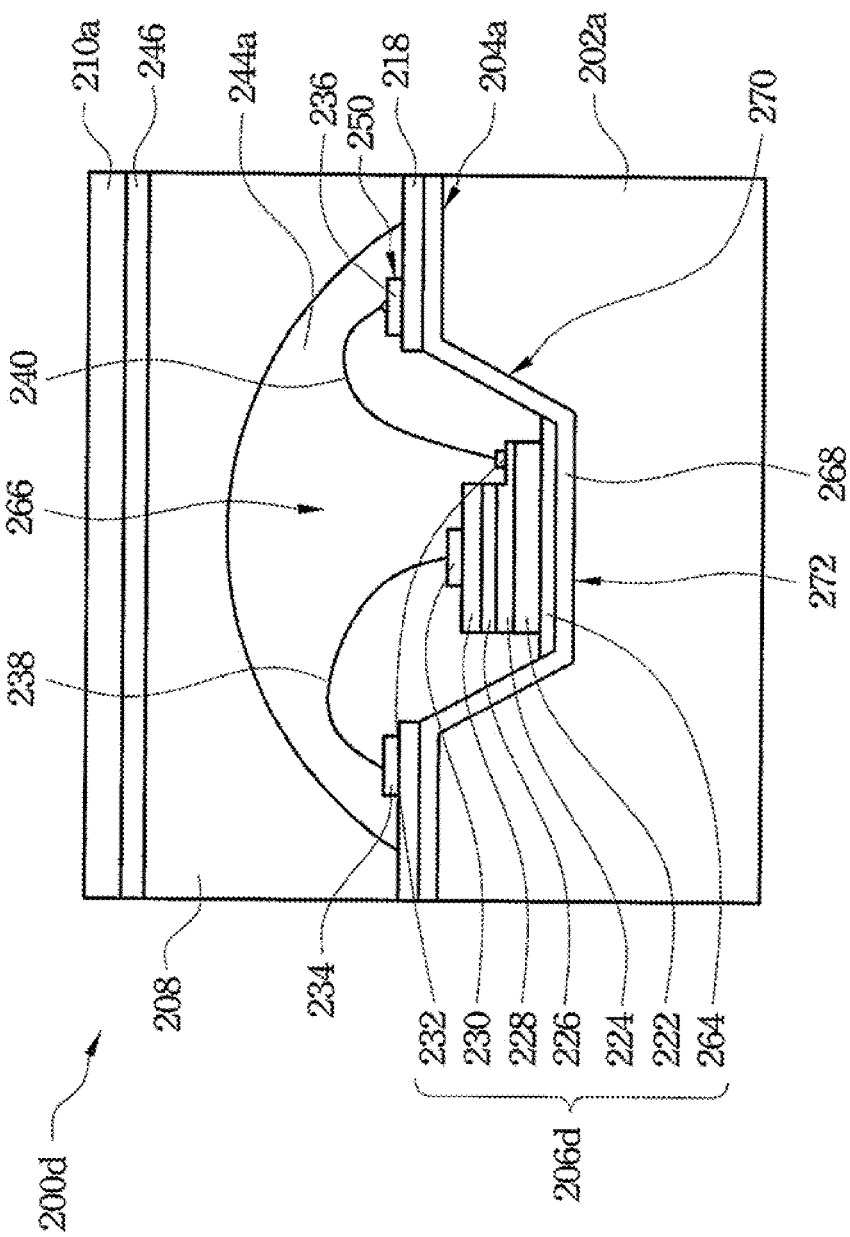
FIG. 5B illustrates a partially enlarged cross-sectional view of a light-emitting diode light source module in accordance with another preferred embodiment of the present invention.

Refer to FIGS. 5A and 5B. FIGS. 5A and 5B respectively illustrate a three-dimensional perspective drawing and a partially enlarged cross-sectional view of a light-emitting diode light source module in accordance with another preferred embodiment of the present invention. In the present exemplary embodiment, the light-emitting diode light source module 200d is similar to the light-emitting diode light source module 200, and the main difference is that a surface 204a of the heat conduction substrate 202a of the light-emitting diode light source module 200d includes a plurality of deeper recesses 266, and the light-emitting diode chips 206d are completely in the recesses 266 correspondingly and are different from the light-emitting diode chips 206, each of which is partially embedded in the recesses 216. Such as shown in FIG. 5B, each of the light-emitting diode chips 206d is disposed on a bottom surface 272 of the recess 266 of the heat conduction substrate 202a and is separated from a side surface 270 of the recess 266 of the heat conduction substrate 202a. In one embodiment, the recess 266 in the surface 204a of the heat conduction substrate 202a may be, for example, bowl-shaped to reflect the lateral light emitted by the light-emitting diode chip 206d.

In one exemplary embodiment, the heat conduction substrate 202a can be formed by providing a mold (not shown) with a plurality of protrusions, plating a heat conduction material such as copper or aluminum on the mold by, for example, an electroplating method, and then separating the mold and the electroplated heat conduction material. The protrusion portions in the mold are respective to recess portions formed in the heat conduction substrate 202a. Therefore, the heat conduction substrate 202a may be, for example, a one-piece structure to provide the light-emitting diode light source module 200d with a larger structural strength. In one embodiment, after the formation of the heat conduction substrate 202a, a reflective layer 268 can be deposited by optional to cover the surface 204a of the heat conduction substrate 202a and the bottom surface 272 and the side surface 270 of each recess 266. The material of the reflective layer 268 may be, for example, a metal layer with a high reflectivity, such as aluminum or sliver, to increase the light-extracting efficiency of the light-emitting diode chips 206d.

In addition, a fluorescent layer 244a of the light-emitting diode light source module 200d is disposed on the surface 204a of the heat conduction substrate 202a and is filled in the recesses 266 to directly cover the light-emitting diode chips 206d, the wires 238 and 240, and the circuits 234 and 236 of the electric conduction layer 250. The fluorescent layer 244a may be partially coated on the recesses 266 of the heat conduction substrate 202a by, for example, a glue-dispensing method, or may be coated on the entire surface 204a of the heat conduction substrate 202a. The material of the fluorescent layer 244a is similar to that of the fluorescent layer 244, and it does not give details herein.

A transparent substrate 210a of the light-emitting diode light source module 200d may be, for example, a glass substrate or an optical polycarbonate (PC) board, wherein the transparent substrate 210a is a flat panel without an additional optical structure set thereon. In one embodiment, a bottom surface of the transparent substrate 210a may be set with the anti-reflection layer 246 to increase the light-extracting efficiency of the light-emitting diode chips 206d.

In the present exemplary embodiment, the light-emitting diode chip 206d is a light-emitting diode structure with horizontal electrodes that is the same as the light-emitting diode chip 206 in the above-mentioned embodiment. However, the light-emitting diode chip 206d may be a light-emitting diode structure with vertical electrodes or a light-emitting diode chip including a flip-chip structure. In each light-emitting diode chip 206d, the first conductivity type semiconductor layer 224 is stacked on the substrate 222, the active layer 226 and the second conductivity type semiconductor layer 228 are stacked on a portion of the first conductivity type semiconductor layer 224 in sequence, the first electrode 232 is disposed on the exposed portion of the first conductivity type semiconductor layer 224, and the second electrode 230 is disposed on the second conductivity type semiconductor layer 228. In one embodiment, a eutectic bonding layer 264 may be selectively disposed to cover the bottom surface of the substrate 222, so that the light-emitting diode chips 206d and the heat conduction substrate 202a can be connected by a eutectic bonding method. The eutectic bonding layer 264 may be a single-layered structure or a multi-layered structure, such as an Sn/Bi structure, a Sn/Bi/Ag structure or a Sn/Ag structure. To fix the light-emitting diode chips 206d on the bottom surfaces 272 of the recesses 266 of the heat conduction substrate 202a, the light-emitting diode chips 206d are firstly disposed on the respective bottom surfaces 272 of the recesses 266 of the heat conduction substrate 202a, and a low temperature infrared ray (IR) reflow process may be then performed to transform the eutectic bonding layers 264 and the underlying metal heat conduction substrate 202a or the metal reflective layer 268 to eutectic structures, so that the light-emitting diode chips 206d are directly adhered on the metal heat conduction substrate 202a and the metal reflective layer 268 via the eutectic structure. The low temperature IR reflow process may be a reflow process performed at substantially 200 degrees Celsius for less than 7 minutes, for example.

In the present exemplary embodiment, the light-emitting diode chips 206d are bonded on the heat conduction substrate 202a by using the eutectic bonding layers 264 and the reflow process, so that the conventional bonding process by heating the sliver glue is not needed. Because the heating temperature of the conventional bonding process by heating the sliver glue is more than 200 degrees Celsius, and the conventional process requires 30 minutes to 2 hours, therefore, the present embodiment can prevent the thermal damage to the light-emitting diode chips 206d caused by the conventional sliver glue heating process. In addition, the thermal resistance of the eutectic bonding layer 264 is less than the thermal resistance of the sliver glue, so that the heat generated by the light-emitting diode chip 206d can be rapidly conducted to the heat conduction substrate 202a and dissipated to the external environment.

In the light-emitting diode light source module 200d of the present exemplary embodiment, the locations, the formation methods and the materials of the insulation layer 218, the electric conduction layer 250, the encapsulation layer 208, the electrical connection methods of the light-emitting diode chips 206d and the circuits 234 and 236 of the electric conduction layer 250, and the fabrication method of the transparent substrate 210a and the heat conduction substrate 202a are similar to those in the light-emitting diode light source module 200, so that it does not give details herein.

All of the light-emitting diode light source module 200a through 200d can be extensively applied on various application products needing light sources, so that each of the light-emitting diode light source modules 200a through 200d may be a light source module of an illumination lamp, an indicator lamp, a bulletin board or an advertisement board, for example.

According to the aforementioned embodiments, one advantage of the present invention is that light-emitting diode chips of a light-emitting diode light source module of the present invention are embedded in a heat conduction substrate, so that the contact area between the light-emitting diode chips and the heat conduction substrate is increased. In addition, the volume of the heat conduction substrate is much larger than those of the light-emitting diode chips, and it is not necessary to use the conventional sliver glue to fix the light-emitting diode chips. Therefore, the heat generated by the light-emitting diode chips can be conducted to the external environment rapidly, and the issue of the reduction of the luminous flux per watt resulting from the superheat of the light-emitting diode chips can be effectively solved.

According to the aforementioned embodiments, another advantage of the present invention is that in the manufacturing of a light-emitting diode light source module of the present invention, light-emitting diode chips are directly integrated to a heat conduction substrate, and the semiconductor fabrication techniques including a film disposition technique, a photolithograph technique and an etching technique cooperating with the conventional wire bonding technique can be used to connect the light-emitting diode chips and the circuit on the circuit substrate. Therefore, it is unnecessary to use polyphthalamide to form a package base of the light-emitting diode, the formation the conventional lead is not needed, and the process of combining the package base and the lead frame is not needed. Accordingly, in comparison with the conventional technique, the present invention has advantages of process simplification and low cost.

According to the aforementioned embodiments, still another advantage of the present invention is that in the fabrication of a light-emitting diode light source module of the present invention, an encapsulation material is filled into a transparent substrate and a heat conduction substrate by a batch method, and a fluorescent layer may be entirely coated on the transparent substrate by a spin coating method or partially coated on the transparent substrate by a screen printing method, so that in comparison with the conventional package method of the light-emitting diode, it is unnecessary to pack the light-emitting diode chips one by one in the present invention. Accordingly, the thicknesses of the entire fluorescent layer and the entire encapsulation layer can be controlled, thereby increasing the uniformity of the process, effectively simplifying the package process and greatly reducing the package time.

According to the aforementioned embodiments, further another advantage of the present invention is that a transparent substrate of a light-emitting diode light source module of the present invention can be set with an optical structure, so that in addition to protecting the underlying light-emitting diode chips, the transparent substrate can enhance optical effects, such as increasing the light-extracting efficiency, enhancing the light uniformity and reducing the light-mixing distance, by designing the optical structure of the transparent substrate. Furthermore, a reflective layer may be disposed on a light-extracting side of the light-emitting diode chip, so that the light-extracting efficiency can be effectively increased.

According to the aforementioned embodiments, still further another advantage of the present invention is that a light-emitting diode light source module of the present invention does not need the conventional lead frame to connect a light-emitting diode package structure, so that the poor collinearity of the light-emitting diode chips caused by the non-uniform solders in the reflow process of the lead frame can be prevented.

As is understood by a person skilled in the art, the foregoing preferred embodiments of the present invention are illustrative of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:
1. A light-emitting diode light source module, comprising:
a heat conduction substrate, wherein a surface of the heat conduction substrate includes a plurality of recesses;

a plurality of light-emitting diode chips respectively disposed in the recesses;
an insulation layer disposed on the surface of the heat conduction substrate outside of the recesses;
an electric conduction layer disposed on the insulation layer, wherein the light-emitting diode chips are electrically connected to the electric conduction layer; and
an encapsulation layer covering the light-emitting diode chips, the electric conduction layer and the insulation layer.

2. The light-emitting diode light source module according to claim 1, further comprising a transparent substrate disposed on the encapsulation layer.

3. The light-emitting diode light source module according to claim 2, wherein the light-emitting diode chips are embedded in the recesses of the heat conduction substrate.

4. The light-emitting diode light source module according to claim 3, further comprising a reflective layer disposed between the light-emitting diode chip and the heat conduction substrate.

5. The light-emitting diode light source module according to claim 2, wherein each of the light-emitting diode chips comprises:
a substrate;
a first conductivity type semiconductor layer disposed on the substrate;
an active layer disposed on a portion of the first conductivity type semiconductor layer;
a second conductivity type semiconductor layer disposed on the active layer, wherein the second conductivity type semiconductor layer and the first conductivity type semiconductor layer have different conductivity types;
a first electrode disposed on another portion of the first conductivity type semiconductor layer; and
a second electrode disposed on the second conductivity type semiconductor layer.

6. The light-emitting diode light source module according to claim 5, wherein the first conductivity type semiconductor layer and the insulation layer have a substantially equal altitude.

7. The light-emitting diode light source module according to claim 2, further comprising a fluorescent layer disposed between the light-emitting diode chips and the transparent substrate.

8. The light-emitting diode light source module according to claim 7, wherein the fluorescent layer covers at least a portion of a bottom surface of the transparent substrate.

9. The light-emitting diode light source module according to claim 7, further comprising an anti-reflection layer, wherein the fluorescent layer is located between the transparent substrate and the anti-reflection layer.

10. The light-emitting diode light source module according to claim 7, further comprising an anti-reflection layer located between the transparent substrate and the fluorescent layer.

11. The light-emitting diode light source module according to claim 2, wherein the transparent substrate comprises an optical structure, and the optical structure includes a plurality of convex lenses, a plurality of prisms, or a sand blasting surface structure.

12. The light-emitting diode light source module according to claim 1, wherein the heat conduction substrate comprises:
a metal substrate; and
an electric conduction compound layer disposed on the metal substrate, wherein the electric conduction compound layer acts as an electroplating seed layer for the metal substrate and an adhere layer to adhere the light-emitting diode chips and the metal substrate.

13. The light-emitting diode light source module according to claim 12, wherein the metal substrate is an electroplated substrate and is adhered to bottoms of the light-emitting diode chips.

14. The light-emitting diode light source module according to claim 12, wherein a material of the metal substrate is Cu or Al.

15. The light-emitting diode light source module according to claim 12, wherein a material of the electric conduction compound layer is ITO, Au, Ag, Pt, Pd, Ni, Cr, Ti, Ta, Al, In, W, Cu, or an alloy containing Ni, Cr, Ti, Ta, Al, In, W or Cu.

16. The light-emitting diode light source module according to claim 12, wherein a thickness of the electric conduction compound layer is substantially less than 3 μm.

17. The light-emitting diode light source module according to claim 1, further comprising a reflective layer disposed on a side surface of each of the recesses.

18. The light-emitting diode light source module according to claim 1, wherein each of the light-emitting diode chips further comprises a eutectic bonding layer covering a bottom surface of the light-emitting diode chips to connect the light-emitting diode chips and the heat conduction substrate.

19. The light-emitting diode light source module according to claim 18, wherein the eutectic bonding layer is a multi-layered structure comprising an Sn/Bi structure, a Sn/Bi/Ag structure or a Sn/Ag structure.

20. The light-emitting diode light source module according to claim 1, further including:
another insulation layer stacked on the insulation layer; and
another electric connection layer, wherein the electric connection layer and the another electric connection layer respectively correspond to the insulation layer and the another insulation layer and are respectively disposed on the insulation layer and the another insulation layer.

* * * * *